United States Patent [19]

Burger

[11] Patent Number: 4,604,689

[45] Date of Patent: Aug. 5, 1986

[54] BUS REPEATER

[75] Inventor: John P. Burger, Sunnyvale, Calif.

[73] Assignee: Convergent Technologies, Inc., San Jose, Calif.

[21] Appl. No.: 485,557

[22] Filed: Apr. 15, 1983

[51] Int. Cl.[4] ........................ G06F 13/36; G06F 13/40

[52] U.S. Cl. ........................ 364/200

[58] Field of Search ... 364/200 MS File, 900 MS File; 340/825.5, 825.05; 370/85, 91, 86

[56] References Cited

U.S. PATENT DOCUMENTS

| | | | |
|---|---|---|---|
| 3,886,524 | 5/1975 | Appelt | 364/200 |
| 4,115,854 | 9/1978 | Capowski et al. | 364/200 |
| 4,148,011 | 4/1979 | McLagan | 364/900 |
| 4,257,095 | 3/1981 | Nadir | 364/200 |
| 4,281,381 | 7/1981 | Ahuja | 364/200 |
| 4,320,457 | 3/1982 | Tanikawa | 364/200 |
| 4,356,550 | 10/1982 | Katzman et al. | 364/200 |
| 4,365,294 | 12/1982 | Stokken | 364/200 |

*Primary Examiner*—James D. Thomas
*Assistant Examiner*—Florin Munteanu
*Attorney, Agent, or Firm*—Townsend & Townsend

[57] ABSTRACT

Method and apparatus for allowing multiple enclosures (10) to be connected so that their respective motherboards (15) together define a single bus. System-wide arbitration is carried out asynchronously on an enclosure basis while arbitration within each enclosure occurs synchronously. A bus repeater (20, 25, 25') is provided at each of the upstream and downstream ends of each enclosure's motherboard. The upstream bus repeater (20) in a given enclosure is coupled by a flexible connector cable (30) to the downstream bus repeater (25, 25') in the enclosure immediately upstream. One of the bus repeaters (say the upstream one) has the status as master or arbiter while the other has the status of a slave. The connector cables have two sets of lines (32, 35), thereby allowing the bus repeaters to pass two basic types of signals: (a) bused signals (address, data) which are made available to the relevant unit boards; and (b) private signals which are passed only to the bus repeaters. The set of private signals comprises two subsets (i) downstream bound, and (ii) upstream bound, each subset of which includes request, busy, grant, and arbitrate signals. Within each enclosure, the bus repeaters monitor the local bus request and bus busy lines, and logically combine them with the upstream bound and downstream bound private request and busy signals.

10 Claims, 8 Drawing Figures

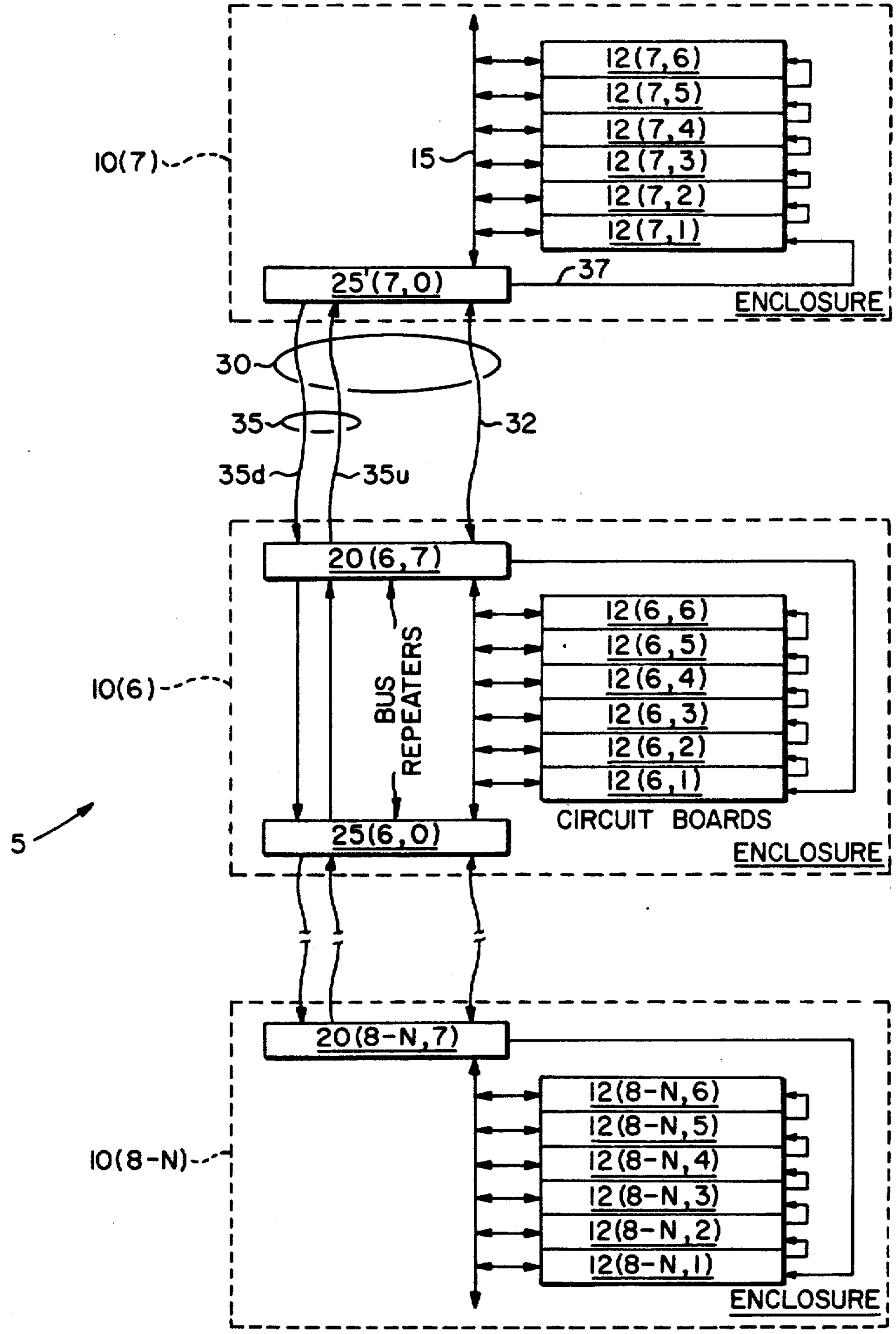
FIG._1.

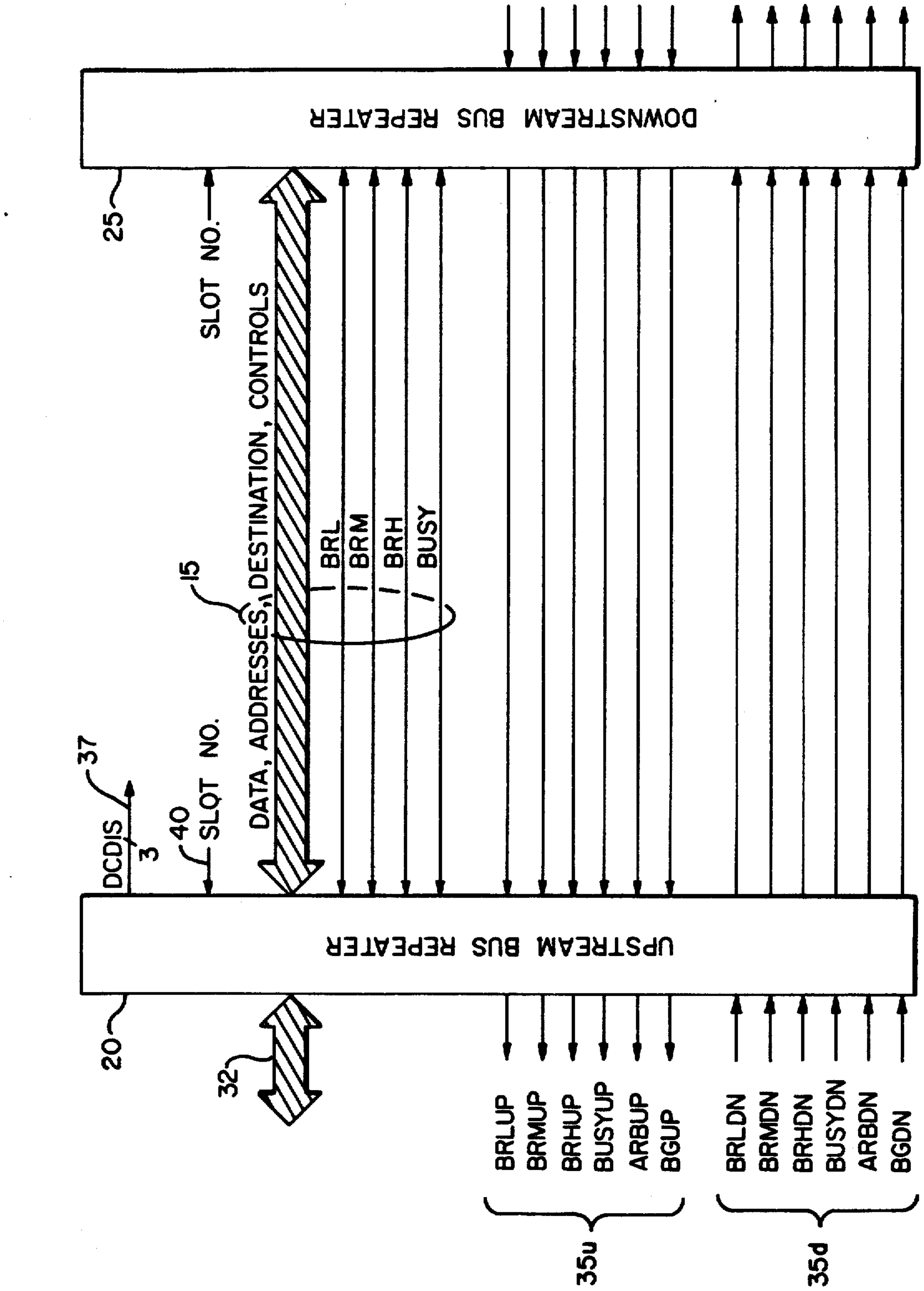
FIG._2.

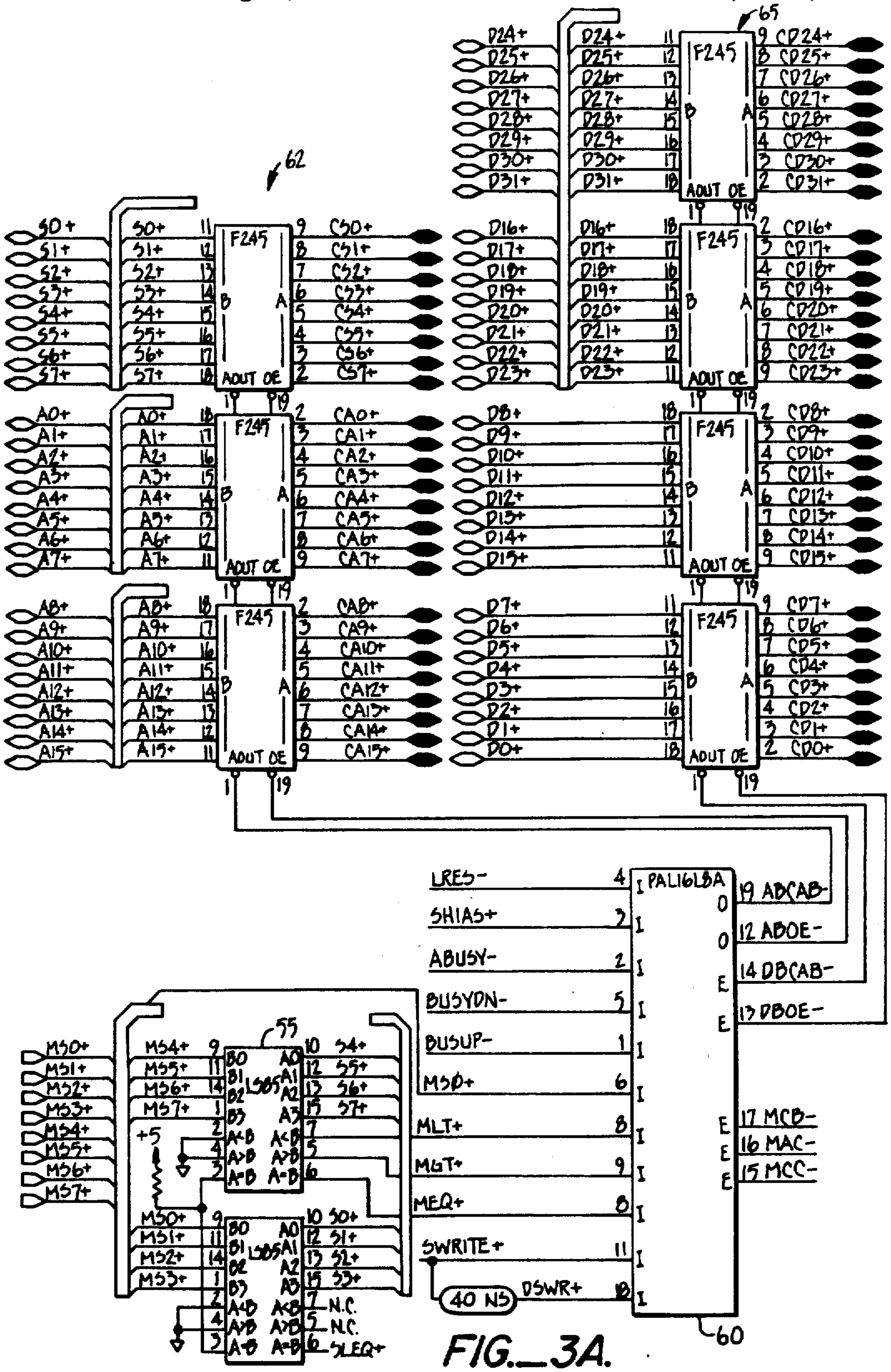
FIG._3A.

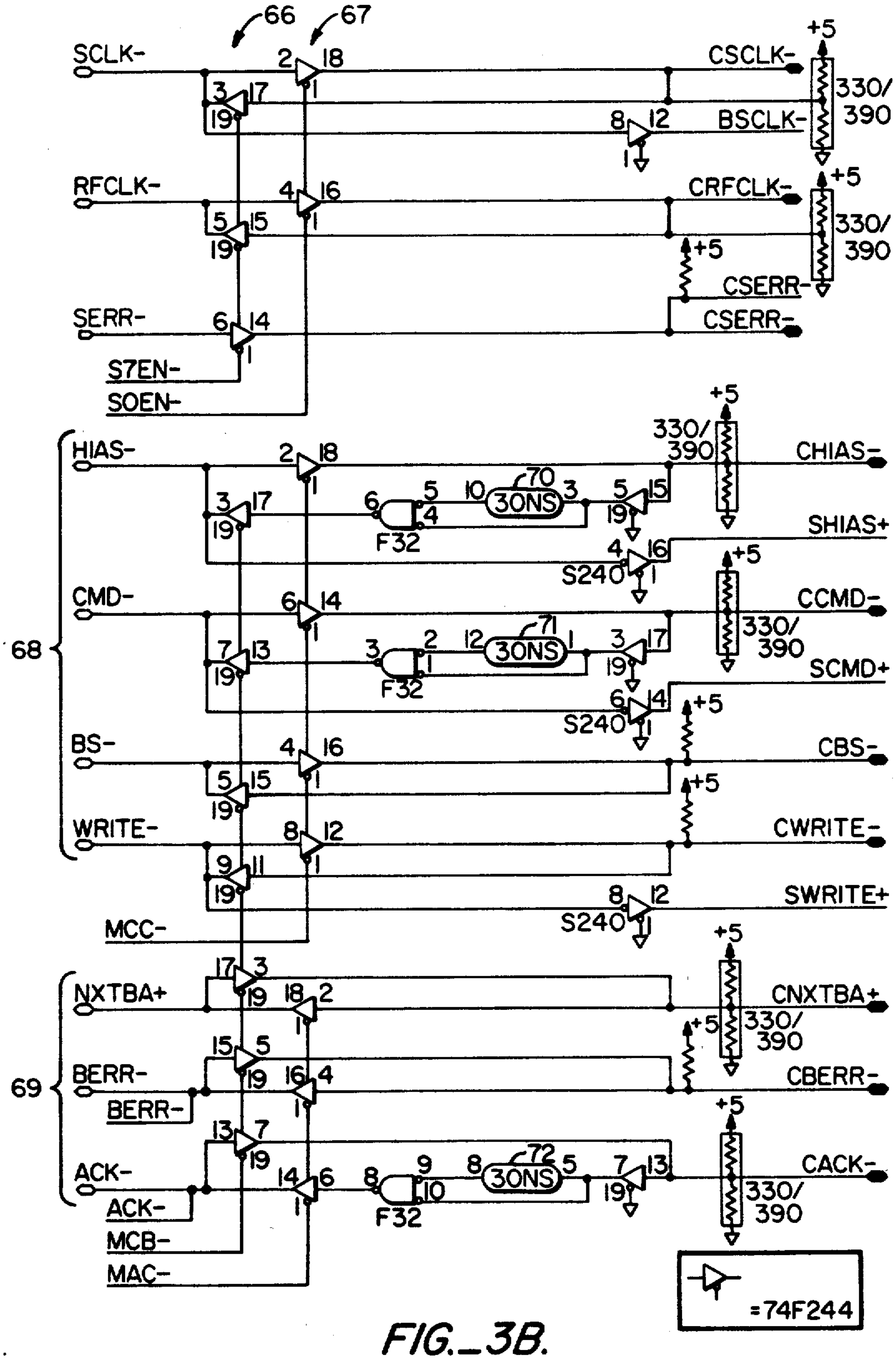
FIG._3B.

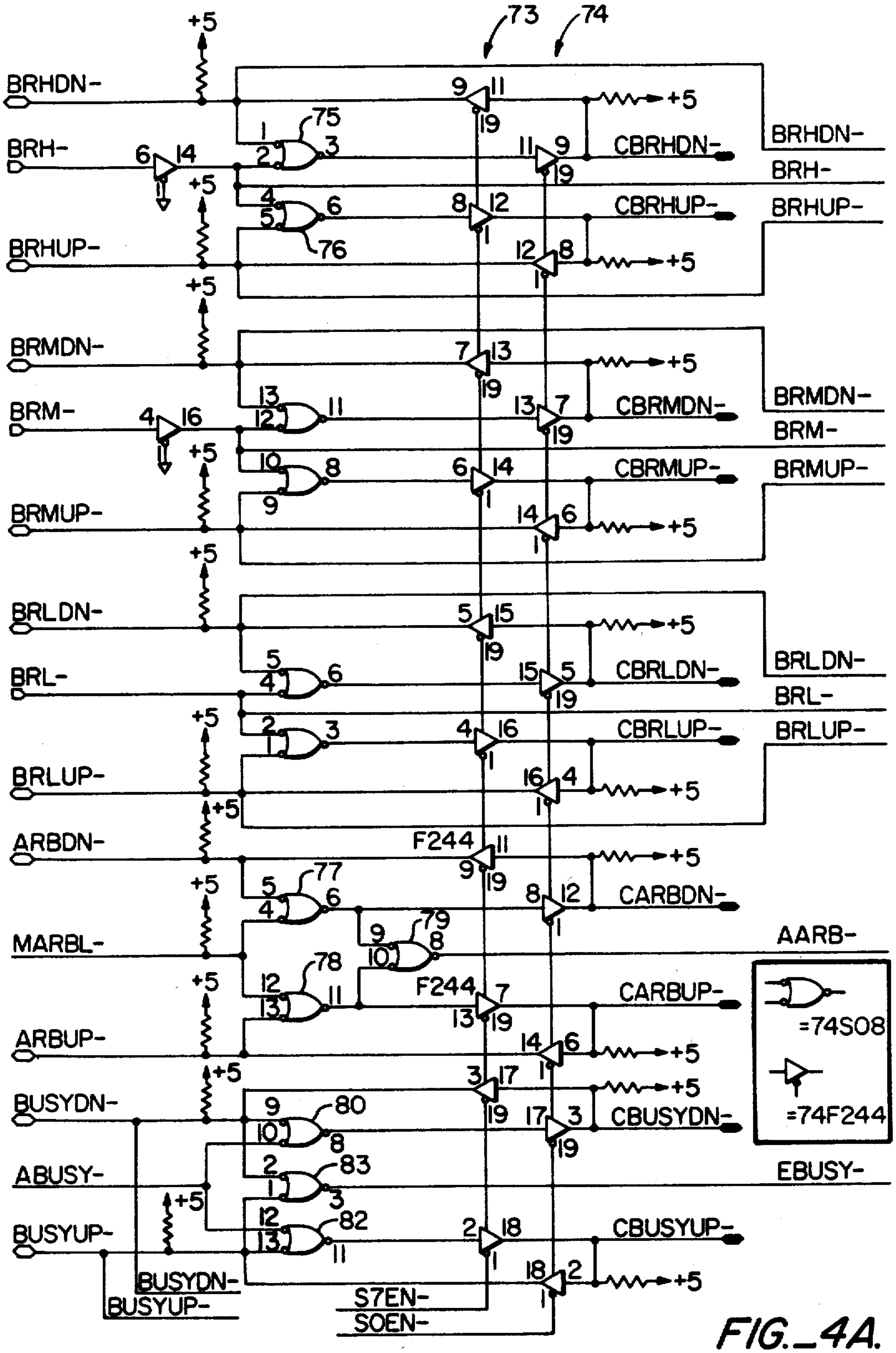
FIG._4A.

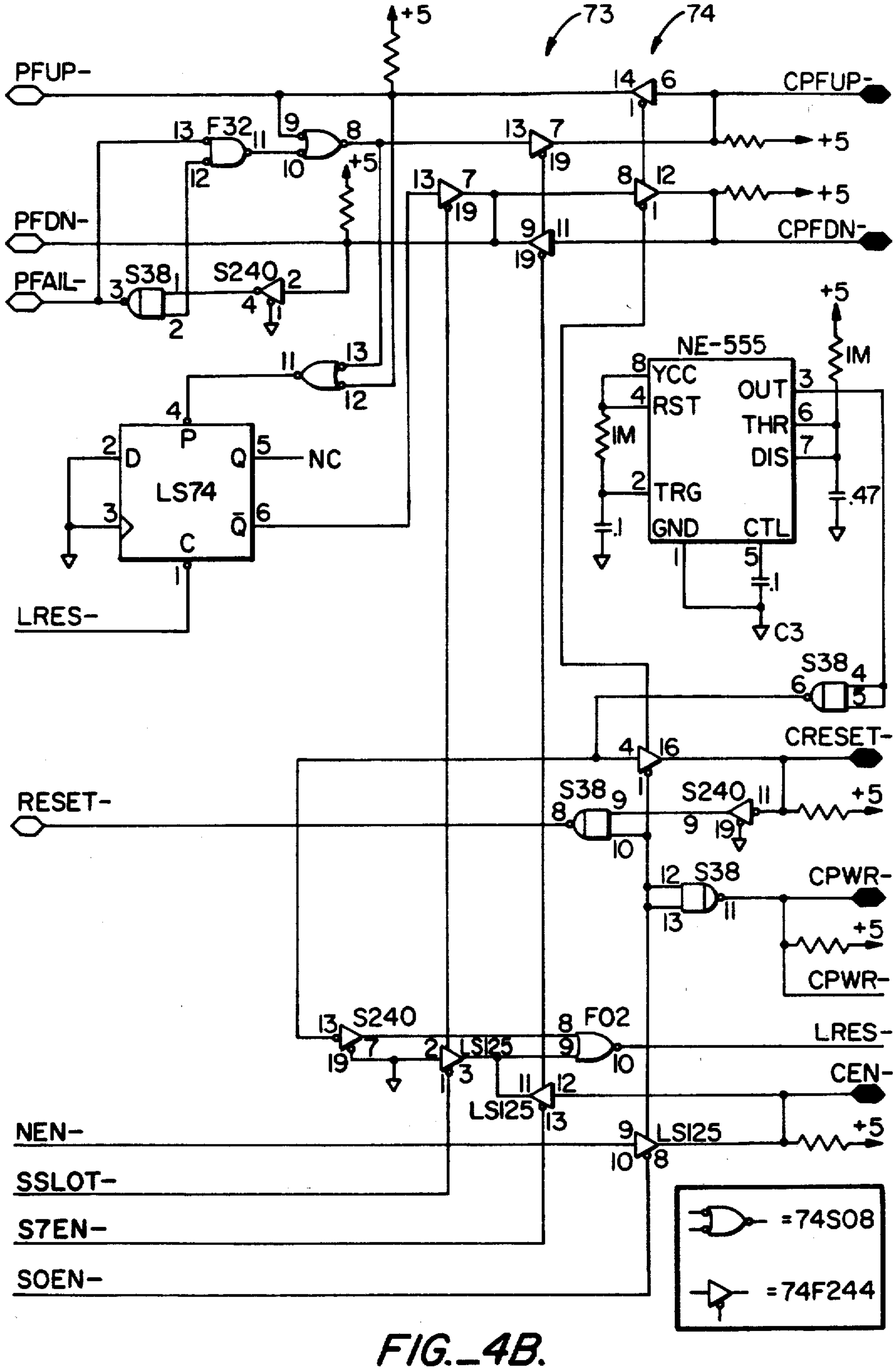
FIG._4B.

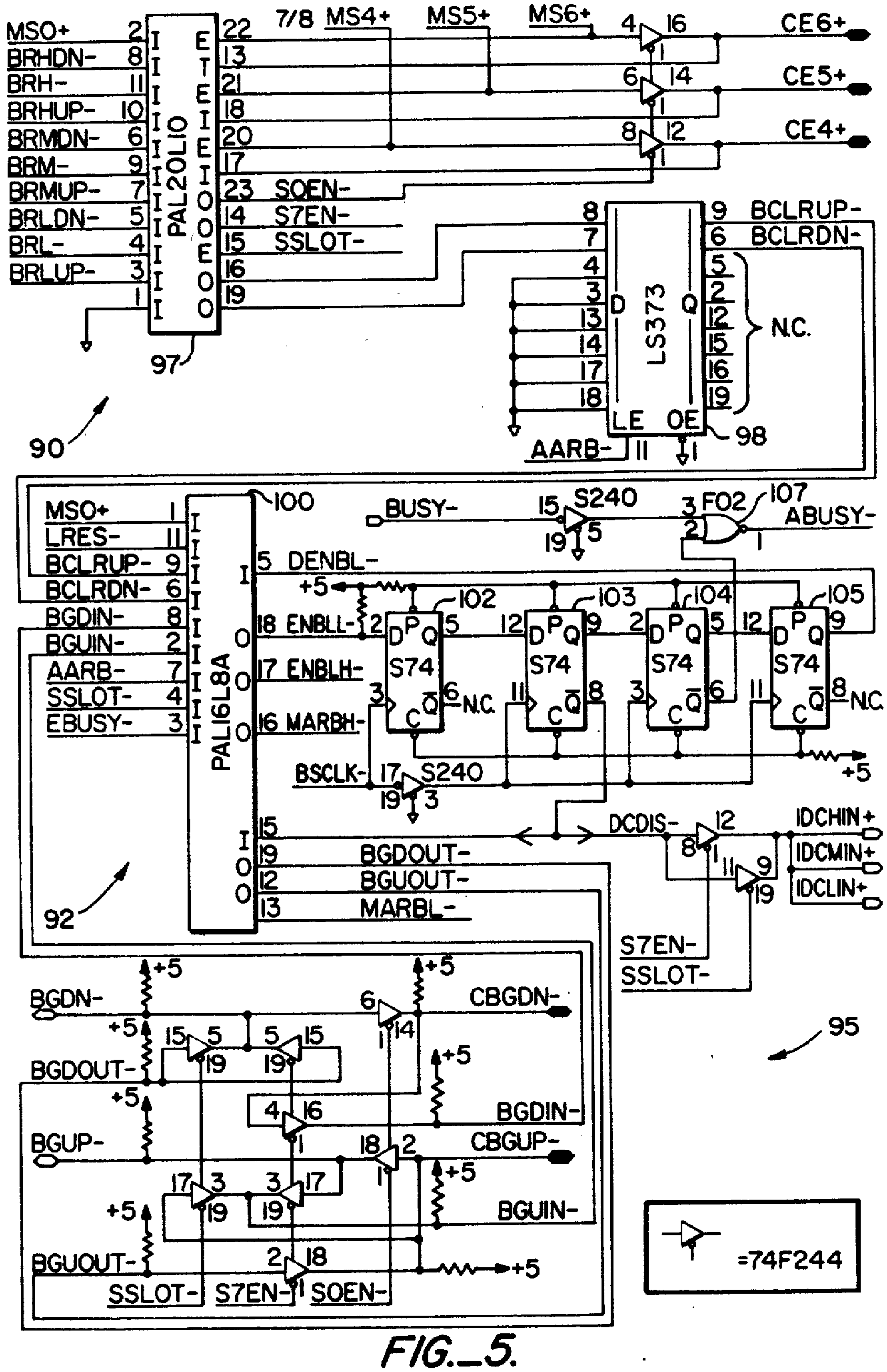
FIG._5.

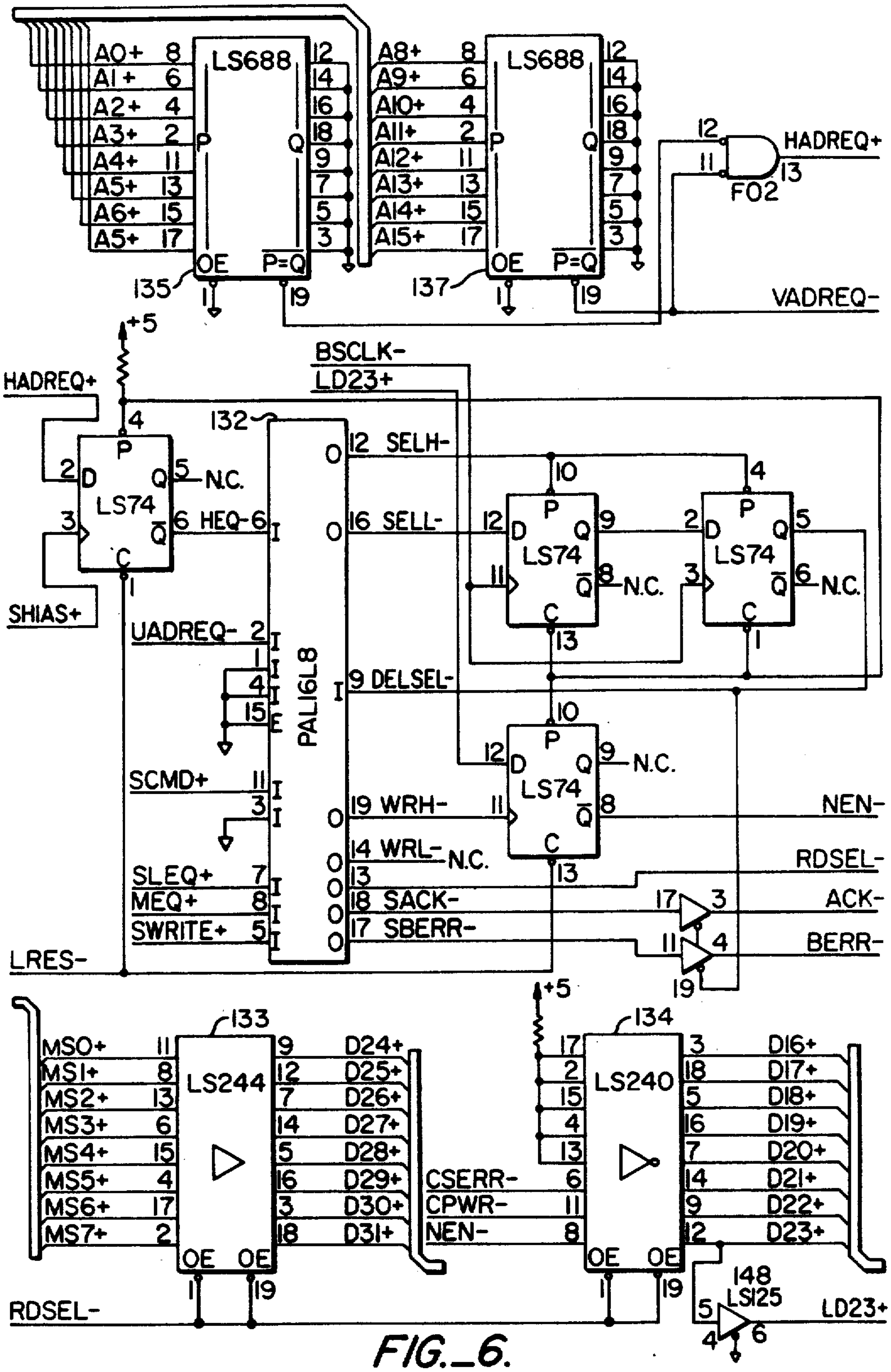
FIG._6.

BUS REPEATER

FIELD OF THE INVENTION

The present invention relates generally to computer systems, and more specifically to a bus arbitration scheme for a multiple enclosure system.

BACKGROUND OF THE INVENTION

A typical computer system includes a number of functional units coupled to a common bus. The functional units, which may include memory controllers, central processor units, or peripheral controller interfaces, communicate with one another over, and compete with one another for use of, the bus lines.

A very effective physical implementation has the functional units built on individual circuit boards ("unit boards" or simply "boards") which plug into corresponding parallel connectors ("slots") on a backplane or motherboard. The connectors maintain the unit boards in spaced parallel relationship with the signal traces on the motherboard extending perpendicularly thereto to define the bused signal lines.

While considerations of physical compactness tend to favor a motherboard with the minimum number of slots, flexibility considerations tend to favor many slots so that a system may be expanded as the user's needs grow.

At first blush, it would appear that one could achieve an ideal compromise by providing multiple enclosures, each having a motherboard with a relatively small number of slots. However, it would not suffice merely to string the motherboards together with connector cables to make a single large bus, since the increased length of the signal path would require a slower bus speed to allow the signals to propagate the entire length of the bus. Additionally, the signal quality may well be degraded if the signals were forced to propagate over a physically long bus.

Prior art approaches have faced these problems by treating each enclosure as a separate subsystem, and providing a communication links between enclosures. Such approaches typically require special protocols for communicating between enclosures.

A further problem arises with arbitrating competing requests for the bus. A single enclosure system usually uses a synchronous bus arbitration scheme which might, for example, operate as follows. The unit boards, in addition to making parallel connection to the bus lines on the motherboards, are serially connected in a physical daisy chain manner. Priorities are assigned strictly on the basis of the boards' relative positions in the enclosure, with any given board having a higher priority than all the boards downstream of it and a lower priority than all the boards upstream of it.

A board wishing to put data on the bus asserts a bus request signal on a dedicated bus line and asserts a disable signal on the daisy chain line to disable all the boards downstream. On the next clock edge, if the requesting board has not been disabled from above, it puts its data on the bus. Depending on the particular implementation, the board may have undisputed use of the bus for a limited number of cycles. After this number of cycles has elapsed, the board can retain control of the bus only if it has not been disabled from above (upstream). In any event, after the board has finished with the bus, it enables the daisy chain line so that the boards downstream can compete for bus cycles. The system is readily expanded to allow multiple levels of priority by providing corresponding multiple request and daisy chain lines. A requesting board, before taking the bus, would then also have to check whether a higher level of request was being asserted.

While there is no conceptual problem in extending the above-outlined synchronous arbitration regime to a multi-enclosure system, practical considerations may render the regime unsuitable. For example, it is often necessary to make the frequency of the clock dependent on the number of enclosures in order to account for propagation delays.

Therefore, despite dramatic advances in the design and implementation of small computers, it has proven very difficult to achieve compactness and a high degree of expandability without degrading overall system performance.

SUMMARY OF THE INVENTION

The present invention provides a method and apparatus for allowing multiple enclosures to be connected so that their respective motherboards together define a single bus. System-wide arbitration is carried out asynchronously on an enclosure basis while arbitration within each enclosure occurs synchronously (as is done in a single enclosure system). The present invention is transparent to the individual boards within the enclosures and permits the bus to operate at full speed during transfers.

Broadly, the present invention contemplates the provision of a bus repeater at each of the upstream and downstream ends of each enclosure's motherboard. The upstream bus repeater in a given enclosure is coupled by a flexible connector cable to the downstream bus repeater in the enclosure immediately upstream. One of the bus repeaters (say the upstream one) has the status as master or arbiter while the other has the status of a slave.

The connector cables have two sets of lines, thereby allowing the bus repeaters to pass two basic types of signals: (a) bused signals (address, data) which are made available to the relevant unit boards; and (b) private signals which are passed only to the bus repeaters.

The bused signals from a given enclosure may be transmitted in one or both directions, and provide the mechanism for a board in one enclosure to communicate with a board in another enclosure. To this end, each bus repeater has bus transceivers coupling the bused lines on its motherboard to the first set of lines in the connector cable.

The set of private signals represent the system-wide state of bus use and requests, and comprises two subsets (i) downstream bound, and (ii) upstream bound, each subset of which includes request, busy, grant, and arbitrate signals. The state of these signals allows the bus repeaters to determine the direction from which requests, grants, and the like are coming, but not to determine the specific enclosure from which they are coming. Within each enclosure, the bus repeaters monitor the local bus request and bus busy lines, and logically combine them with the upstream bound and downstream bound private request and busy signals.

At any given moment, one of the enclosures will have the status of bus master, meaning that a board within that enclosure has requested and gained control of the bus. The arbiter bus repeater in each enclosure knows, on the basis of the private signals, whether it is in an enclosure that is the current bus master, that is upstream from the current bus master, or that is downstream from the current bus master. In view of which condition prevails, the bus repeaters control their bus transceivers to drive the address lines in the appropriate direction.

When a board in an enclosure that is not the bus master wishes to use the bus, it asserts a bus request signal on its motherboard's local bus request line. The bus repeaters at each end of the motherboard combine this request with the private request signals and pass the updated private request signals to the adjacent bus repeaters, whereupon the request is ultimately communicated to the bus master. When the arbiter bus repeater in the bus master determines that it is to relinquish control of the bus, it passes a bus grant signal in the appropriate direction. Each arbiter bus repeater in the direction in which the bus grant signal was transmitted senses the incoming grant signal, and compares any bus requests coming from the other direction to see whether it should take control of the bus or pass the grant signal along. Only if it determines that its enclosure is to become the bus master, does the repeater enable the daisy chain line for the boards within its enclosure, thus ensuring that none of its enclosure's boards can get control of the bus except when entitled to it. In this manner, bus mastership is exchanged without the need for any set number of bus cycles to elapse.

According to a further aspect of the present invention, the current bus master, upon determining that is is to relinquish control of the bus, precedes the issuance of a grant signal by the issuance of a state definition signal, designated the arbitrate signal. The arbitrate signal is propagated to all the other enclosures, which latch the states of their local requests (as well as the upstream and downstream bound request signals). Then, when the relinquishing bus repeater issues the grant signal (in one direction or the other), each bus repeater receiving the signal can determine whether to take the grant or pass it along, without having to wait until its requests are latched and settled. Thus, since the propagation speed of the grant is the same as that of the arbitrate signal, the delay due to settling time is incurred only once. In this manner, the exchange of mastership occurs as rapidly as the grant signals can propagate from the old bus master to the new bus master.

While the arbitration and exchange of bus mastership occur in an asynchronous manner, the normal synchronous arbitration regime within a given enclosure occurs as in the single enclosure case. Thus, the bus repeaters, by sensing incoming signals from the adjacent enclosures, and passing these signals and derivative signals along, are able to carry out asynchronous arbitration without knowing the entire system or even which enclosure is the current bus master. The system gives the bus mastership to the highest requesting enclosure, at the right time.

For a further understanding of the nature and advantages of the present invention, reference should be made to the remaining portions of the specification and to the attached drawings.

BRIEF DESCRIPTION OF THE DRAWINGS

FIG. 1 is a block diagram illustrating the relationship of the enclosures in a multiple enclosure computer system;

FIG. 2 is a block diagram illustrating the bus repeaters and private signal lines for one of the enclosures;

FIGS. 3–6 provide a schematic of one of the bus repeaters;

FIGS. 3A–B show the buffers and direction control circuitry;

FIGS. 4A–B show the state passing circuitry;

FIG. 5 shows the main logic including request monitoring, arbitration, and grant passing circuitry; and FIG. 6 shows remaining portions of the circuitry.

DESCRIPTION OF THE PREFERRED EMBODIMENTS

System Overview

FIG. 1 is a block diagram of a computer system 5 having a plurality of N enclosures 10. In the preferred embodiment N may be up to eight. The enclosures are numbered from 7 downward and are designated 10(7), 10(6), . . . 10(8-N). Enclosure 10(7) has the status of system master and has responsibility for configuring the system at power up.

With exceptions to be described below, each enclosure includes a plurality of functional units 12 (implemented on individual circuit boards and sometimes referred to simply as "boards") which communicate with one another (and with boards in other enclosures) on a set of bused lines 15. Lines 15 are preferably implemented as circuit traces on a backplane or motherboard with the individual circuit boards plugging into transversely disposed connectors or slots. As will be more fully described later, the motherboards are serially connected, with the direction away from enclosure 10(7) being considered downstream and the direction toward enclosure 10(7) being considered upstream.

For definiteness, it will be assumed that each enclosure has eight slots, numbered from 7 to 0 proceeding downstream. Each of slots(1–6) may be occupied by one of circuit boards 12; slot(0) and slot(7) are occupied by bus repeaters. More particularly, with the exception of the first enclosure 10(7) and the last enclosure 10(8-N), each enclosure includes a so-called upstream bus repeater 20 in slot(7) and a so-called downstream bus repeater 25 in slot(0). Enclosure 10(7) has only a downstream bus repeater 25' while enclosure 10(8-N) has only an upstream bus repeater. Bus repeaters and boards within an enclosure are shown with two parenthetical subscripts. The first denotes the enclosure number; the second the slot number within the enclosure.

Each downstream bus repeater is coupled via a flexible connector cable 30 to the upstream bus repeater of the serially adjacent enclosure. Connector cable 30 includes a first set of signal lines 32, corresponding generally to bused lines 15, and a second set of private signal lines 35 which communicate a set of private signals to other bus repeaters in the system but not to the unit boards in the system. Private signal lines 35 include a subset of lines 35*d* which carry downstream-bound private signals and a subset of lines 35*u* which carry upstream-bound private signals. It is the nature of each of the private signals that it carries no signature of any particular enclosure, but rather that it only signifies to a receiving enclosure that one or more enclosures upstream (or downstream) has caused the assertion of the signal.

Broadly, the bus repeaters use the private signals to carry out asynchronous bus arbitration on an enclosure basis, while the boards within an enclosure arbitrate bus use synchronously. In each enclosure, one of the bus repeaters has the status of master or arbiter while the other has the status of slave. In the preferred embodiment it is upstream bus repeater 20 which is the arbiter, except for enclosure 10(7) where it is downstream bus repeater 25' (the only bus repeater in that enclosure.)

The present invention is not limited to a particular intra-enclosure arbitration scheme, but for purposes of illustration, the preferred scheme will be outlines. The boards in an enclosure are coupled to a common clock line, a common request line, and a common busy line. Each board (except possibly the first) has an enable input; each board (except possibly the last) has an enable output. A board, when disabled at its input, asserts a disable signal at the output. When enabled at its input, the board has control over its output. The enable outputs and inputs are serially connected in a daisy chain fashion so that each board, by asserting a disable signal at its output, can disable all the boards below it on the daisy chain.

A board wishing to use the bus asserts a request signal on the common request line, and disables the boards below it on the daisy chain. On the next clock edge, the requesting board, if it has not been disabled from above and the bus is not busy, takes control of the bus by driving the busy line and removing its request, and enables its bus drivers to place its data on the bus. Once the board has finished using the bus, it removes the busy signal and enables the boards below it.

In the preferred embodiment to be described below, a board may request at one of three priority levels, high, middle, and low. The high level is used for direct memory access ("DMA") or other high speed bus traffic, the middle level is reserved, and the low level used for normal memory fetches. There are three bus request lines and three daisy chain lines corresponding to the three levels. In such a system (with multiple request levels), the board requesting at a given level only disables that level and lower for the boards below it, and prior to taking control of the bus, also checks to see that there are no higher level requests asserted.

This arbitration scheme is extended to the multiple enclosure case by having the arbiting bus repeater in the enclosure control the daisy chain enable inputs for the highest priority boards. That is, each of upstream bus repeaters 20 and downstream bus repeater 25' in enclosure 10(7) controls a daisy chain disable line 37 which, when driven, disables all three levels of the board in slot(1), which in turn causes the remaining boards in the enclosure to become disabled.

FIG. 2 is a block diagram illustrating the bus repeaters and private signal lines for one enclosure. The following discussion will be concerned with the nature of the various signals handled by the bus repeaters, the basic circuit functions within the bus repeaters, and the overall operation of the bus repeaters.

Bused lines 15 include a 32-bit data bus D0–D31, a 16-bit address bus A0–A15, an 8-bit destination bus S0–S7 (4 bits for enclosure number and 4 bits for slot number), and a variety of control lines including a system clock line and strobe lines for validating data and addresses. Additionally, there are three bus request lines BRL, BRM, and BRH, corresponding to the three levels of request, and a BUSY line which is driven when a board in the enclosure has been granted and has taken control of the bus.

Each slot on the motherboard is provided with a set of inputs 40 whose low order bits (MS0–MS3) specify the slot number and whose high order bits (MS4–MS7) specify the enclosure number. MS0–MS3 are typically implemented as hardwired traces on the motherboard so that a board, when plugged into a slot, can ascertain what its slot number is. A bus repeater can determine whether it is an upstream or a downstream bus repeater solely on the basis of MS0. MS4–MS7 (actually only MS4–MS6) are set at power up as will be described below.

The upstream-bound signals on lines **35*u*** include:

three bus request signals BRHUP, BRMUP, and BRLUP;

a busy signal BUSYUP;

a bus grant signal BGUP; and a state definition or arbitrate signal ARRBUP.

Lines **35*d*** carry the corresponding downstream-bound signals BRHDN, BRMDN, BRLDN, BUSYDN, BGDN, and ARBDN.

The circuitry within the bus repeaters includes the following:

(a) buffers and associated direction control circuitry (see description of FIGS. 3A–B below);

(b) state passing circuitry (see description of FIGS. 4A–B below);

(c) request monitoring and latching circuitry, central arbitration circuitry, and grant passing circuitry (see description of FIG. 5 below); and (d) miscellaneous circuitry not directly concerned with the present invention (see description of FIG. 6 below).

The function, interrelationship, and operation of the circuit portions enumerated above are best understood by considering the operation of the bus repeaters. To make the discussion concrete, the following outline of the operation will consider the sequence of events occurring when a first board in a first enclosure sends a message to and receives a response from a second board in a second enclosure. In describing the operation of the bus repeaters, reference will be made to the bus master. Simply put, only one board in the system can have the bus at any time, and that board's enclosure is the bus master. As a shorthand form of expression, the arbiter bus repeater in the enclosure may itself be referred to as the bus master. Thus, in the following discussion, the current bus master (first enclosure) will determine to relinquish control of the bus and pass mastership to a different enclosure which then takes mastership so that its board can gain control of the bus.

Consider the state of the system while the message is being sent. During this time, the first board is driving the local bus lines (on the motherboard) and the bus repeaters in the bus master control their bus transceivers to pass the signals onto the connector cable signal lines so that the signals propagate outwardly to their destination. Each bus receiver that receives these signals controls its own bus transceivers to pass the signals along to their destination.

The second board, upon receiving the message, proceeds to perform whatever operations are necessary, and at a certain point has its response ready for transmission. The second board asserts a request signal on the appropriate local request line. The state passing circuitry for the repeaters in the second enclosure logically combines the local request signals with the upstream-bound and downstream-bound private request signals. The state passing circuitry (for the other enclosures) passes the requests (as combined with those enclosures' local requests) so that the request ultimately reaches the arbiter bus repeater in the enclosure that is the current bus master. Note that the bus master may or may not be the enclosure that had the status of bus master when the message was originally sent, as mastership may have been exchanged in the interim. The current bus master constantly monitors its own request lines as well as the state of the upstream-bound and downstream-bound request lines. At a certain point the bus master determines that it is to relinquish control of the bus. It also determines in which direction to pass mastership.

Having determined that it is to relinquish the bus, the bus master causes the arbitrate signals ABRUP and ARBDN to be asserted. These arbitrate signals propagate upstream and downstream to all the other enclosures in the system, and cause all the enclosures, upon receipt thereof, to latch the state of their request monitoring circuitry. The relinquishing bus master then issues a grant (asserts BHUP or BGDN, depending on the direction in which it has determined to pass bus mastership). The grant signal is propagated to the serially adjacent enclosure. This enclosure, once it has latched the state of its local request lines, determines whether it is to seize the grant or pass it along. Assume that it passes the grant along to the next enclosure. By the time the grant signal gets to the next enclosure, that enclosure will already have latched the state of its request lines in response to the arbitrate signal, so that no further settling time delays are incurred. Finally, the grant arrives at an enclosure which determines to seize the grant. Note that this may or may not be the second enclosure (the one with the responding board), since another enclosure may have asserted a higher level request. The grant seizing enclosure then synchronizes to the bus clock, enables its daisy chain line, and drives the BUSYUP and BUSYDN lines. The requesting board in the enclosure then seizes control, drives the local busy line which reinforces the BUSYUP and BUSYDN signals, and removes its request.

Circuit Description

The specific circuitry for the bus repeaters will now be described. In the preferred embodiment, the upstream and downstream bus repeaters are identically configured, but only portions of the circuitry are enabled in each. The enabled circuitry in the slave bus repeater, for the most part, consists of buffers, with the bulk of the logic being carried out by the arbiter bus repeater.

In the preferred embodiment, a variety of logic functions are implemented in programmable array logic devices (PALs) which allow a variety of logical functions consisting primarily of AND and OR terms, to be implemented on a single chip. It is, of course, to be understood that the present invention could be implemented with discrete logic. The logical structure of a PAL is characterized by its truth table. The truth tables for the PALs are set forth in separate appendices, and will be referenced as appropriate.

In the schematics, connections to signal lines outside the bus repeater are denoted by pentagonal or hexagonal pin symbols. A solid dark symbol denotes connection to one of the connector cables; an open symbol denotes connection to a circuit trace on the motherboard. Signal names will be followed by a "+" or "−" depending on whether the active level is high or low.

FIGS. 3A–B are schematics of the buffering and direction control circuitry. FIG. 3A shows the direction control circuitry and buffers for the slot or destination field (S0–S7), the data field (D0–D31), and the address field (A0–A15). An input comparator 55 compares the high order bits of the destination field (S4–S7) with the enclosure number (MS4–MS7) to generate signals MLT, MGT, and MEQ which represent the position of the enclosure relative to the destination enclosure. These signals as well as BUSYUP and BUSYDN are communicated to a direction control PAL 60 which provides direction control signals ABCAB, ABOE, DBCAB, DBOE, MCC, MCB, and MAC. The logical definition of these signals is set forth in Appendix 1.

The buffering circuitry includes address and destination bus transceivers 62 and data bus transceivers 65. ABCAB and ABOE control address and destination bus transceivers 62. As can be seen from the truth table, ABOE is asserted when one and only one of BUSYUP, BUSYDN, and ABUSY is asserted. This signifies that the address lines are to be driven in some direction. ABCAB determines which direction. More particularly, if the enclosure is the bus master, both the upstream and downstream bus repeaters drive the cables so that the addresses are propagated in both directions. Otherwise, the upstream bus repeater drives the address lines upstream if BUSYUP is asserted, and the downstream bus repeater drives the address lines downstream if BUSYDN is asserted.

DBOE and DBCAB control data bus transceivers 65. The direction determination is similar to that for the addresses, but the situation is somewhat more complicated because the appropriate direction, in addition to depending on the relative location of the current bus master, depends on whether reading or writing is to be done.

FIG. 3B shows the buffering circuitry for those control signals that serve to validate and define the nature of the bus traffic. These signals include a 100-ns clock SCLK, a refresh clock RFCLK, and a system error signal SERR. These signals are passed by buffers 66 which are enabled in the upstream bus repeater and buffers 67 which are enabled in the downstream bus repeater.

The control signals also include a group 68 (HIAS, CMD, BS, WRITE) which are driven by the bus repeater closest to the destination, and a group 69 (NXTBA, BERR, ACK) which are driven by the bus repeater closest to the bus master. These signals relate to the actual bus communication, not to the bus arbitration.

Addresses are 32 bits and are sent on two cycles. The high order 16 bits are placed on the address bus on the first cycle; the low order 16 bits on the next. DMA transfers occur in 8-cycle bursts, with the high order address bits being placed on the bus only once and the low order address bits being placed on the bus on the next eight cycles. The signals in group 67 include HIAS which validates the high order address bits, CMD which validates the low order address bits and the data bits on a write, and BS which is a byte strobe encoded with a A0–A1 to specify byte selection. The signals in group 68 include NXTBA which is used to tell the master that it can put the next low order address on the bus, BERR which specifies a bus error, and ACK which acknowledges a cycle, validates data on a read, and indicates acceptance of data on a write.

It should be noted that the signals HIAS, CMD, and ACK are passed through respective delay lines 70, 71 and 72 which eliminate spurious effects due to signal skew. These signals, which are used to validate data and addresses on the bus, are delayed by an amount that exceeds any relative delays of the accompanying data and addresses to be validated.

FIGS. 4A-B are schematics of state passing circuitry which operates to combine the upstream-bound and downstream-bound private signals with locally generated corresponding signals. This circuitry includes a first set of buffers 73 which are enabled when the bus repeater is an upstream bus repeater (S7EN asserted) and a second set of buffers 74 which are enabled when the bus repeater is a downstream bus repeater (S0EN asserted).

The local request signals are "ORed" into the upstream-bound and downstream-bound request signals. The local BRH signal is combined with the downstream-bound BRHDN signal at a gate 75, the output of which is communicated to one of buffers 74 to drive the downstream cable. In a like manner, the local BRH signal is combined with the BRHUP signal at a gate 76, the output of which is communicated to one of buffers 73 to drive the upstream cable. Thus, the logical combination for the downstream-bound signals occurs in the downstream bus repeater while the logical combination of the upstream-bound signals occurs in the upstream bus repeater. The middle and low level request are handled the same way.

In a similar fashion ARBUP and ARBDN are combined with a local arbitrate signal MARBL at respective gates 77 and 78 to drive the cable signal lines in the appropriate direction. Additionally, the outputs of gates 77 and 78 are combined at a gate 79 to provide a local signal AARB which signifies that an arbitrate signal has been generated either upstream, downstream, or locally. Unlike the requests, where many enclosures may be requesting at the same time, only one enclosure (the bus master) should be generating an arbitrate signal at any one time.

The BUSYDN and BUSYUP signals are combined with a local ABUSY signal at respective gates 80 and 82 to drive the cable lines as described above. Additionally, BUSYDN and BUSYUP are combined at a gate 83 to generate a local EBUSY signal signifying that the bus is being driven by a board external to the bus repeater's enclosure. Only one board in the system should be driving the busy line at any one time.

FIG. 4B shows the manner in which local power failure signals PFAIL are combined with private versions PFUP and PFDN. These private signals do not bear directly on the present invention.

FIG. 5 is a schematic of the basic arbitration circuitry which includes request monitoring circuitry 90, central arbitration circuitry 92, and grant passing circuitry 95. Request monitoring circuitry 90 includes a PAL 97 (see Appendix 2) which receives as inputs the various private and local request signals, and generates bus clearing signals BCLRUP and BCLRDN. BCLRUP is asserted when a higher level request than that pending locally is coming from upstream; BCLRDN when a higher level request is coming from downstream. For example, BCLRUP is asserted when either a low level request is coming downstream (from upstream) and no level of request is being asserted locally, when a middle level request is coming downstream and no high or middle level of request is being asserted locally, or when a high level request is coming downstream and no high level request is being asserted locally. These bus clearing signals are fed through a tansparent latch 98, and are latched when AARB is asserted, signifying that either MARBL (discussed below) or ARBUP or ARBDN is asserted.

Additionally, PAL 97 provides buffer enabling control signals S7EN (for upstream bus repeaters 20), S0EN (for downstream bus repeaters 25), and SSLOT (for downstream bus repeater 25° in enclosure 10(7)).

PAL 97 also includes the circuitry for setting the slot numbers (MS4–MS6) for each enclosure throughout the system. More particularly, the signals CE4–CE6 are sent downstream on the cable, reflecting the originating enclosure's number (defined by MS4–MS6). As can be seen from the truth taable, the PAL decrements the value by "1", thus defining the next enclosure number. Bus repeater 25' has MS4–MS6 hardwired high to define binary "7".

Bus grant passing circuitry 95 basically consists of buffers which receive the upstream-bound and downstream-bound grant signals, transmit local versions thereof to central arbitration circuitry 92, receive signals representative of whether the bus grant is to be passed along, and pass those signals along.

Central arbitration circuitry 92 includes a central arbitration PAL 100 (see Appendix 3), and a chain of cascaded flip-flops 102, 103, 104, and 105.

Consider first the sequence of events and signals when the enclosure is to take control of the bus. PAL 100 monitors local versions BGDIN and BGUIN of the incoming grant signals as well as the bus clearing signals BCLRUP and BCLRDN. When it determines that it is to take control of the bus by seizing the incoming grant signal, PAL 100 asserts a signal ENBLL which is communicated to the input of the first flip-flop 102. ENBLL and a complementary signal ENBLH communicate to flip-flop circuitry within PAL 100. When ENBLL is asserted, it forces ENBLH to the opposite state which then keeps ENBLL asserted, even when the conditions for ENBLL disappear. Only when ENBLH is asserted, is ENBLL withdrawn.

It should be noted the ENBLL is asserted asynchronously, that is, without regard to the bus clock. ENBLL is clocked through flip-flop 102 on the next clock edge, and through flip-flop 103 on the following edge of an inverted clock which is the same clock that defines the bus timing for the boards in the enclosure. The complementary output of flip-flop 103 enables the daisy chain by withdrawing DCDIS. The daisy chain enable signal is able to propagate in less than the 100 ns bus time, so that the board in the enclosure that takes the bus is able to drive the local busy line. The third flip-flop 104 then clocks through the enable signal so that a gate 107 is able to drive ABUSY. As discussed above, the assertion of ABUSY causes the assertion of BUSYDN and BUSYUP which are propagated outwardly to the other enclosures in the system. The fourth flip-flop 105 communicates its output, designated DENBL, back to PAL 100. This ensures that enough time has elapsed for the requesting board within the enclosure, that is, the board which has just received control of the bus according to the synchronous intra-enclosure arbitration scheme, to remove its request. Only at this point does PAL 100 look at the bus clearing signals with the possibility of asserting MARBL in order to give up control of the bus.

Now consider the sequence when the enclosure determines that it is to give up control of the bus. As seen in the truth table for PAL 100, this can only occur in the absence of incoming bus grants and after DENBL has been asserted. At that point, the bus clear signals are effective to cause the assertion of MARBL, which then causes the ARBUP and ARBDN signals to be sent out to the other enclosures for them to latch their requests. MARBL and a complementary signal MARBH have a set-reset relationship (as with ENBLL and ENBLH) so that MARBL, once asserted, remains asserted until MARBH is asserted.

FIG. 6 is a schematic of configuration circuitry which includes a configuration PAL 132 (see Appendix 4) and registers 133 and 134. Associated with PAL 132 are comparators 135 and 137 for generating output signals LADREQ and HADREQ when particular signals are detected on the address bus. The registers are used when enclosure 10(7) is powered up so that it can be determined how many enclosures are in the system.

In summary it can be seen that the present invention provides apparatus and a method for arbitrating bus requests among boards in several enclosures in a manner that is completely transparent to the boards. The system of upstream-bound and downstream-bound private signals provides each bus repeater in the data path just the information it needs to make the relevant decisions for arbitrating all the requests. The arbitration, being asynchronous, can occur as quickly as the signals can propagate. The use of the arbitrate signals, asserted prior to the outbound grant signal, minimizes the delays due to latch settling time, and provides a well-defined state of the system for decisions to be made. The present invention may be overlaid on a single enclosure system to allow expansion without changing the protocols for synchronous bus arbitration within the enclosure.

While the above provides a full and complete description of the preferred embodiments of the present invention, various modifications, alternate constructions and equivalents may be employed without departing from the true spirit and scope of the invention. For example, while the above described bus repeaters included sufficient circuitry for the bus repeater to function either as the arbiter or the slave, an alternate embodiment could eliminate redundant circuitry and have different bus repeaters for slot(0) and slot(7). Additionally, while the system described above treats a request at a given level as having the same priority as other requests at that level, regardless of the enclosure position, it would be possible to implement a system wherein equal priority requests could be prioritized according to enclosure position. Therefore, the above description and illustrations should not be construed as limiting the scope of the invention which is defined by the appended claims.

| Appendix 1 - Direction Control PAL 60 | |
|---|---|
| IF (VCC) ABOE = | /LRES * ABUSY * /BUSYDN * /BUSYUP + |
| | /LRES * /ABUSY * BUSYDN * /BUSYUP + |
| | /LRES * /ABUSY * /BUSYDN * BUSYUP |
| IF (VCC) DBOE = | /LRES * ABUSY * /BUSYDN * /BUSYUP * SHIAS * |
| | SWRITE * DSWR + |
| | /MS0 * /LRES * ABUSY * /BUSYDN * /BUSYUP * |
| | SHIAS * MLT * /MEQ */MGT * /SWRITE * /DSWR + |
| | MS0 * /LRES * ABUSY * /BUSYDN * /BUSYUP * |
| | SHIAS * /MLT * /MEQ * MGT * /SWRITE * /DSWR + |
| | /LRES * /ABUSY * BUSYDN * /BUSYUP * SHIAS + |
| | /LRES * /ABUSY * /BUSYDN * BUSYUP * SHIAS |
| IF (VCC) ABCAB = | ABUSY * /BUSYDN * /BUSYUP + |
| | MS0 * /ABUSY * /BUSYDN * BUSYUP + |
| | /MS0 * /ABUSY * BUSYDN * /BUSYUP |
| IF (VCC) DBCAB = | ABUSY * /BUSYDN * /BUSYUP * SWRITE * DSWR + |
| | MS0 * /ABUSY * /BUSYDN * BUSYUP * SWRITE * DSWR + |
| | /MS0 * /ABUSY * /BUSYDN * BUSYUP * /SWRITE * /DSWR + |
| | MS0 * /ABUSY * BUSYDN * /BUSYUP * /SWRITE * /DSWR + |
| | /MS0 * /ABUSY * BUSYDN * /BUSYUP * SWRITE * DSWR |
| IF (VCC) MCC = | /LRES * ABUSY * /BUSYDN * /BUSYUP + |
| | /LRES * MS0 * /ABUSY * /BUSYDN * BUSYUP + |
| | /LRES * /MS0 * /ABUSY * BUSYDN * /BUSYUP |
| IF (VCC) MAC = | /LRES * MS0 * ABUSY * /BUSYDN * /BUSYUP * |
| | SHIAS * /MLT * /MEQ * MGT + |
| | /LRES * /MS0 * ABUSY * /BUSYDN * /BUSYUP * |
| | SHIAS * MLT * /MEQ * /MGT + |
| | /LRES * MS0 * /ABUSY * /BUSYDN * BUSYUP + |
| | /LRES * /MS0 * /ABUSY * BUSYDN * /BUSYUP |
| IF (VCC) MCB = | /LRES * MS0 * /ABUSY * BUSYDN * /BUSYUP + |
| | /LRES * /MS0 * /ABUSY * /BUSYDN * BUSYUP |

| Appendix 2 - Request Monitor PAL 97 | |
|---|---|
| IF (MS0) MS6 = | CE6 * CE5 + |
| | CE6 * CE4 |
| IF (MS0) MS5 = | CE5 * CE4 + |
| | /CE5 * /CE4 |
| IF (MS0) MS4 = | /CE4 |
| IF (VCC) S7EN = | MS0 |
| IF (VCC) SOEN = | /MS0 |
| IF (VCC) SSLOT = | /MS0 * CE6 * CE5 * CE4 |
| IF (VCC) BCLRUP = | BRLDN * /BRH * /BRM * /BRL + |
| | BRMDN * /BRH * /BRM + |
| | BRHDN * /BRH |
| IF (VCC) BCLRDN = | BRLUP * /BRH * /BRM * /BRL + |
| | BRMUP * /BRH * /BRM + |
| | BRHUP * /BRH |

| Appendix 3 - Central Arbitration PAL 100 | |
|---|---|
| IF (VCC) OE = | SSLOT + |
| | MS0 |
| IF (OE) BGUOUT = | /LRES * AARB * BGUIN * BCLRUP + |
| | /LRES * MARBL * DCDIS * BCLRUP * /EBUSY |

-continued

| Appendix 3 - Central Arbitration PAL 100 | |
|---|---|
| IF (OE) BGDOUT = | /LRES * AARB * BGDIN * BCLRDN + /LRES * MARBL * DCDIS * /BCLRUP * BCLRDN * /EBUSY |
| IF (OE) MARBL = | /DCDIS * /LRES * DENBL * /BGDIN * /BGUIN * BCLRUP * /EBUSY + /DCDIS * /LRES * DENBL * /BGDIN * /BGUIN * BCLRDN * /EBUSY + /MARBH |
| IF (OE) MARBH = | LRES + EBUSY + DCDIS * /BCLRUP * /BCLRDN + /MARBL |
| IF (OE) ENBLL = | SSLOT * LRES + /LRES * AARB * BGUIN * /BCLRUP * /EBUSY + /LRES * AARB * BGDIN * /BCLRDN * /EBUSY + /LRES * MARBL * DCDIS * /EBUSY * /BCLRUP * /BCLRDN + /ENBLH |
| IF (OE) ENBLH = | LRES * /SSLOT + MARBL * /DCDIS * /LRES + /ENBLL |

| Appendix 4 - Configuration PAL 132 | |
|---|---|
| IF (VCC) SELL = | HEQ * SLEQ * MEQ * SCMD * UADREQ |
| IF (VCC) SELH = | /SELL |
| IF (VCC) RDSEL = | HEQ * SLEQ * MEQ * SCMD * UADREQ * /SWRITE |
| IF (VCC) WRL = | HEQ * SLEQ * MEQ * SCMD * UADREQ * DELSEL * SWRITE |
| IF (VCC) WRH = | /WRL |
| IF (VCC) SACK = | SLEQ * MEQ * SCMD |
| IF (VCC) SBERR = | SLEQ * MEQ * /HEQ * SCMD + SLEQ * MEQ * /UADREQ * SCMD |

I claim:

1. A computer system comprising:

a plurality of N enclosures, each having a motherboard carrying bused address and data lines for communication to at least one circuit board within the enclosure, and having means for generating local busy and request signals;

N-1 downstream bus repeaters, each being located at the downstream end of the motherboard of a corresponding one of enclosures 1 . . . , N-1;

N-1 upstream bus repeaters, each being located at the upstream end of the motherboard of a corresponding one of enclosures 2 . . . , N; and N-1 connector cables for serially coupling said enclosures, each connector cable coupling the downstream bus repeater in a corresponding enclosure to the upstream bus repeater in the serially adjacent enclosure, the cable that is coupled to the upstream or downstream bus repeater of a particular enclosure being designated the upstream or downstream cable, as the case may be, for that particular enclosure;

each connector cable having a first set of lines corresponding to said address and data lines and a second set of private lines having a first subset of private lines for passing downstream-bound private signals and a second subset of private lines for passing upstream-bound private signals;

said first subset of private lines including lines for passing downstream-bound busy and request signals, the downstream-bound busy and request signals arriving at a particular enclosure being representative of the status of bus use and bus requests for all enclosures, if any, upstream of that particular enclosure;

said second subset of private lines including lines for passing upstream-bound busy and request signals the upstream-bound busy and request signals arriving at a particular enclosure being representative of the status of bus use and bus requests for all enclosures, if any, downstream of that particular enclosure;

wherein the upstream and downstream bus repeaters in a given enclosure include between them the following buffering means for coupling the data and address lines of said given enclosure to the connector cable or cables coupled to said given enclosure, thereby defining a system bus in which interenclosure communication can occur, means for receiving said downstream-bound busy and request signals on the first subset of private lines of the upstream cable, if any, for said particular enclosure, means for sensing the local busy and request signals within said given enclosure;

means for combining the local busy and request signals in said given enclosure with said downstream-bound busy and request signals arriving at said given enclosure to generate updated downstream-bound busy and request signals representative of the status of bus use and bus requests for all enclosures upstream of and including said given enclosure, means for placing said updated downstream-bound busy and request signals on the first subset of private lines of the downstream cable, if any, for said given enclosure, means for receiving said upstream-bound busy and request signals on the second subset of private signal lines of the downstream cable, if any, for said particular enclosure, means for combining the local busy and request signals in said given enclosure with said upstream-bound busy and request signals arriving at said given enclosure to generate updated upstream-bound busy and request signals representative of the status of bus use and bus requests for all enclosures downstream of and including said given enclosure, means for placing said updated upstream-bound busy and request signals on the second subset of private lines of the upstream cable, if any, for said given enclosure, and request monitoring circuitry, responsive to said upstream-bound and downstream-bound private signals arriving at said given enclosure and to the local request signal, for determining according to a defined protocol whether another enclosure has higher priority than the given enclosure for bus use.

2. The invention of claim 1 wherein said first subset of private lines include a line, designated BGDN, for passing a downstream-bound grant signal, wherein said second subset of private lines includes a line, designated BGUP, for passing an upstream-bound grant signal, and wherein the upstream and downstream bus repeaters in said given enclosure further include between them the following:

means for receiving said downstream-bound grant signal on the BGDN line of the upstream cable, if any, for said given enclosure and the upstream-bound grant signal on the BGUP line of the downstream cable, if any, for said given enclosure; and means, responsive to signals from said request monitoring circuitry, for determining whether to seize an incoming grant signal or to pass said incoming grant signal to the next serially adjacent enclosure.

3. The invention of claim 2 wherein said first subset of private lines includes a line, designated ARBDN, for passing a downstream-bound state definition signal, wherein said second subset of private lines includes a line, designated ARBUP, for passing an upstream-bound state definition signal, and wherein the upstream and downstream bus repeaters in said given enclosure further include between them the following:

arbitration means, responsive to signals from said request monitoring circuitry, for generating a state definition signal when said arbitration means determines that said given enclosure, originally in control of said system bus, is to relinquish control to another enclosure;

means for communicating said state definition signal to the other enclosures in the computer system by placing said state definition signal on the ARBUP line of the upstream cable, if any, and the ARBDN line of the downstream cable, if any, for said given enclosure;

latch means, associated with said request monitoring circuitry, for freezing the state of said request monitoring circuitry on the receipt of a state definition signal such as aforesaid;

means for generating a grant signal following said state definition signal; and means for communicating said grant signal to other enclosures in the computer system by placing said grant signal on the BGDP line of the upstream cable, if any, for said given enclosure, or on the BGDN line of the downstream cable, if any, for said given enclosure, depending on the direction said grant signal is to be passed;

whereupon the bus repeaters in the other enclosures in the computer system, each of which includes latch means such as aforesaid, proceed to activate their respective latch means to freeze the respective states of their request monitoring circuitry in response to the receipt of said state definition signal so that by the time they receive said grant signal, they have already frozen the respective states of their requesting monitoring circuitry in response to the previously issued state definition signal.

4. In a computer system having N enclosures, each enclosure having a motherboard carrying bused signal lines for communication to at least one circuit board within the enclosure and further having means for generating local request and local busy signals representative of bus request and bus use within that enclosure, the improvement comprising:

N-1 connector cables, each of said connector cables having a first set of signal lines for bused signals that are communicated to circuit boards within the computer system and a second set of signal lines for private signals; and bus repeater means in each of the enclosures for interfacing said motherboards to said connector cables so that said enclosures are serially coupled with said first set of lines together with the motherboard bused signal lines defining a system bus on which a circuit board in one enclosure can pass information to a circuit board in another enclosure;

said private signals including upstream-bound busy and request signals and downstream-bound busy and request signals representative of bus use and bus requests;

the bus repeater means in each enclosure having means for combining the local busy and request signals in that enclosure with said upstream-bound busy and request signals arriving at that enclosure and with said downstream-bound busy and request signals arriving at that enclosure;

the bus repeater means in each enclosure further having means, responsive to the local busy and request signal in that enclosure and to said upstream-bound and downstream-bound busy and request signals arriving at that enclosure, for determining according to a defined protocol whether another enclosure has a higher bus priority.

5. Bus repeater apparatus for use in a given enclosure within a multi-enclosure computer system wherein each enclosure includes one or more circuit boards coupled to a set of bused data and address lines, with associated local arbitration means for resolving competing bus requests among such circuit boards and for allowing a circuit board to control the bused data and address lines, and wherein the enclosures are serially coupled so that the bused data and address lines for all the enclosures define a system bus, said bus repeater apparatus comprising:

buffering means for receiving and driving bused data and address signals to permit communication between a circuit board within the given enclosure and a circuit board within another enclosure;

direction control circuitry for providing signals to said buffering circuitry to determine in which direction circuit addresses and data should be passed;

state passing means including means for receiving a set of private signals from other bus repeater apparatus in the computer system, said private signals including upstream-bound busy, request, and grant signals and downstream-bound busy, request, and grant signals, the downstream-bound busy and request signals arriving at the given enclosure being representative of the status of bus use and bus requests for all enclosures, if any, upstream of the given enclosure, the upstream-bound busy and request signals arriving at the given enclosure being representative of the status of bus use and bus requests for all enclosures, if any, downstream of the given enclosure, means for sensing local busy and request signals originating within the given enclosure, means for combining the local busy and request signals in the given enclosure with the downstream-bound busy and request signals to generate updated downstream-bound busy and request signals representative of the status of bus use and bus requests for all enclosures upstream of and including the given enclosure, means for combining the local busy and request signals in the given enclosure with the upstream-bound busy and request signals to generate updated upstream-bound busy and request signals representative of the status of bus use and bus requests for all enclosures downstream of and including the given enclosure;

request monitoring circuitry, coupled to said state passing means, responsive to said local bus request signal originating within the given enclosure, and responsive to the upstream-bound and downstream-bound request signals arriving at the given enclosure, for comparing the state of local bus requests with the state of incoming private bus request signals;

means, responsive to signals from said request monitoring circuitry and to said upstream-bound and downstream-bound grant signals, for determining whether to seize an incoming upstream-bound or downstream-bound grant signal; and means, responsive to signals from said determining means, for enabling the local arbitration means so as to allow a circuit board in the given enclosure to place signals on the bused data and address lines.

6. The invention of claim 5, and further comprising:

arbitration means, responsive to signals from said request monitoring circuitry, for generating a state definition signal when said arbitration means determines that the given enclosure, originally in control of said system bus, is to relinquish control to another enclosure;

means for communicating said state definition signal to the other enclosures in the computer system; and means for generating a grant signal following the generation of said state definition signal;

whereupon bus repeater apparatus in the other enclosures in the computer system, in response to the receipt of said state definition signal, can prepare for the later grant signal and therefore quickly determine whether to seize the grant or to pass it along.

7. The invention of claim 5, and further comprising:

arbitration means, responsive to signals from said request monitoring circuitry, for generating a state definition signal when said arbitration means determines that the given enclosure, originally in control of said system bus, is to relinquish control to another enclosure;

means for communicating said state definition signal to the other enclosures in the computer system;

latch means, associated with said request monitoring circuitry, for freezing the state of said request monitoring circuitry on the receipt of a state definition signal such as aforesaid; and means for generating a grant signal following the generation of said state definition signal;

whereupon bus repeater apparatus in the other enclosures in the computer system, each of which includes latch means such as aforesaid, proceed to activate their respective latch means to freeze the respective states of their request monitoring circuitry in response to the receipt of said state definition signal so that by the time they receive said grant signal, they have already frozen the respective states of their request monitoring circuitry in response to the previously received state definition signal.

8. The invention of claim 3, and further comprising means associated with the motherboard of said given enclosure for specifying whether a bus repeater is an upstream or a downstream bus repeater, and wherein the upstream and downstream bus repeaters in said given enclosure having identically configured circuitry, and each of said upstream and downstream bus repeaters includes means, responsive to said specifying means, for selectively disabling portions of the circuitry to allow one of said bus repeaters to function as an arbiter and the other of said bus repeaters to function as a slave.

9. The invention of claim 8 wherein the arbiter is the upstream bus repeater.

10. The invention of claim 1 wherein each of said local request signal, said upstream-bound request signal, and said downstream-bound request signal includes a plurality of signal components, representative of requests at a corresponding plurality of priorities.

* * * * *